US006862189B2

(12) United States Patent
Higuchi

(10) Patent No.: US 6,862,189 B2
(45) Date of Patent: Mar. 1, 2005

(54) ELECTRONIC COMPONENT, CIRCUIT DEVICE, METHOD FOR MANUFACTURING THE CIRCUIT DEVICE, AND SEMICONDUCTOR DEVICE

(75) Inventor: Kazuhito Higuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 471 days.

(21) Appl. No.: 09/961,172

(22) Filed: Sep. 24, 2001

(65) Prior Publication Data

US 2002/0060904 A1 May 23, 2002

(30) Foreign Application Priority Data

Sep. 26, 2000 (JP) ........................................ 2000-291795

(51) Int. Cl.$^7$ ............................. H05K 7/10; H05K 7/12
(52) U.S. Cl. ..................... 361/767; 361/761; 361/762; 361/763; 361/764; 361/767; 361/773; 361/735; 257/686; 257/777; 257/784; 257/785; 257/688; 257/696; 257/719
(58) Field of Search ................................. 257/686, 688, 257/777, 696, 784–785, 719; 438/109, 118, 613; 361/760–764, 767, 773, 735; 29/846

(56) References Cited

U.S. PATENT DOCUMENTS

| 5,115,545 | A | * | 5/1992 | Fujimoto et al. ........... 29/25.01 |
| 5,343,363 | A | * | 8/1994 | Greeson et al. ............. 361/749 |
| 5,394,608 | A | * | 3/1995 | Tottori et al. ................ 29/840 |
| 5,757,072 | A | * | 5/1998 | Gorowitz et al. ........... 257/700 |
| 5,875,100 | A | * | 2/1999 | Yamashita ................... 361/764 |
| 6,002,592 | A | * | 12/1999 | Nakamura et al. .......... 361/760 |
| 6,051,093 | A | * | 4/2000 | Tsukahara ................... 156/251 |
| 6,218,728 | B1 | * | 4/2001 | Kimura ....................... 257/693 |
| 6,239,980 | B1 | * | 5/2001 | Fillion et al. ............... 361/760 |
| 6,335,566 | B1 | * | 1/2002 | Hirashima et al. .......... 257/686 |
| 6,337,513 | B1 | * | 1/2002 | Clevenger et al. .......... 257/706 |
| 6,404,052 | B1 | * | 6/2002 | Kurita et al. ................ 257/737 |
| 6,420,664 | B1 | * | 7/2002 | Muramatsu et al. ........ 174/262 |
| 6,476,467 | B2 | * | 11/2002 | Nakamura et al. .......... 257/668 |
| 6,528,870 | B2 | * | 3/2003 | Fukatsu et al. ............. 257/685 |
| 6,552,419 | B2 | * | 4/2003 | Toyosawa .................... 257/668 |
| 6,586,836 | B1 | * | 7/2003 | Ma et al. ..................... 257/723 |
| 6,690,583 | B1 | * | 2/2004 | Bergstedt et al. ........... 361/763 |
| 6,803,663 | B2 | * | 10/2004 | Hashimoto ................... 257/777 |
| 2002/0089043 | A1 | * | 7/2002 | Park et al. ................... 257/668 |

FOREIGN PATENT DOCUMENTS

JP            11-220262          8/1999

OTHER PUBLICATIONS

Rao R. Tummala, et al, The Microelectronics for the 21$^{st}$ Century with Integral Passive Integration, 1999 IEMT/IMC Proceedings pp. 217–224.

* cited by examiner

Primary Examiner—Amir Zarabian
Assistant Examiner—Thanh Y. Tran
(74) Attorney, Agent, or Firm—Oblon, Spivak, McClelland, Maier & Neustadt, P.C.

(57) ABSTRACT

An electronic component including an element main body section for performing an electrical function and a terminal section for electrically connecting the element main body section to a conductive member of an external device, the electronic component comprises a pair of sections arranged above the terminal section and opposite to each other in a stacking direction of the electronic component and a distance between the sections corresponding to a maximum thickness of the electronic component.

1 Claim, 5 Drawing Sheets

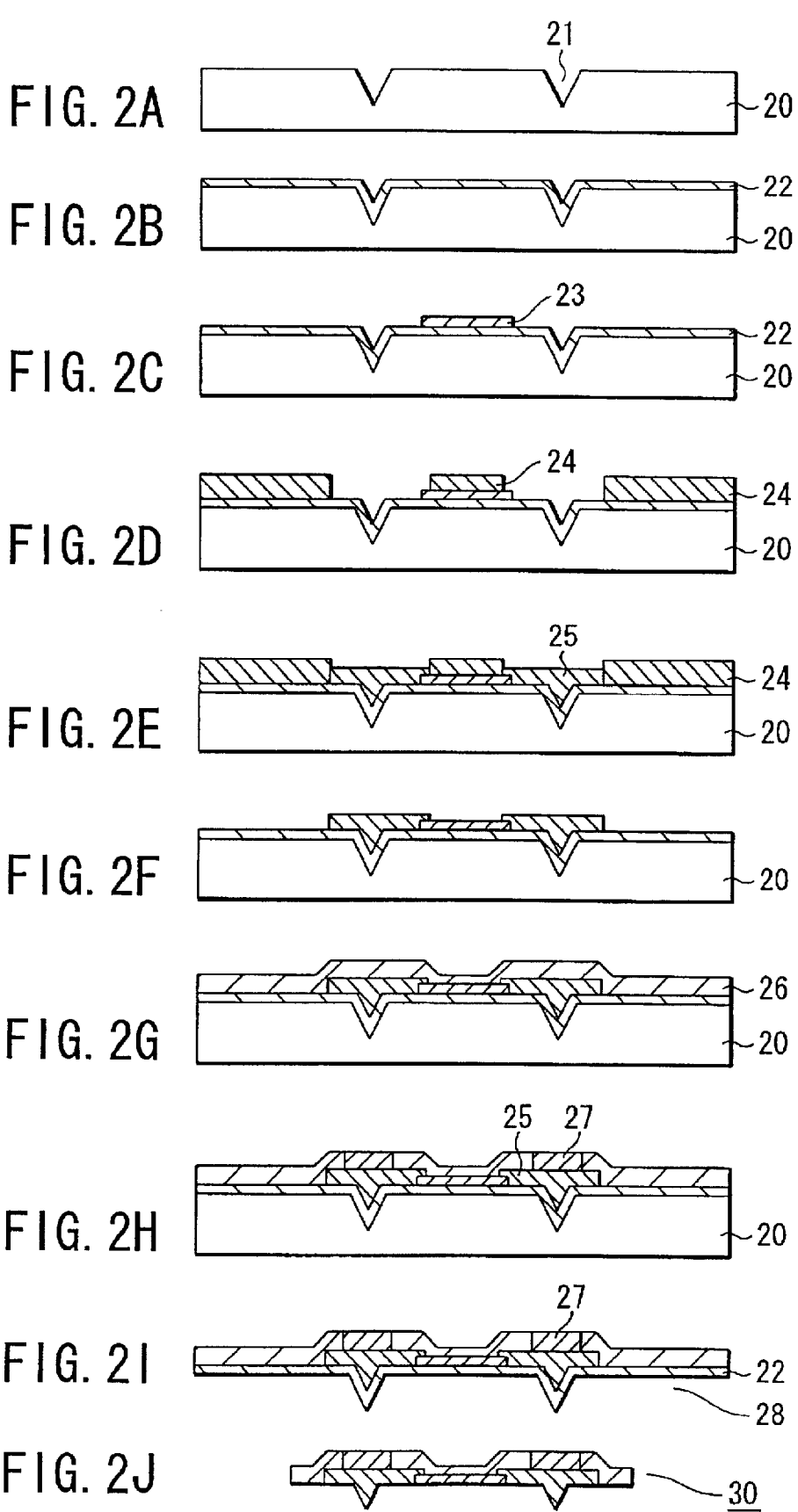

ELECTRONIC COMPONENT, CIRCUIT DEVICE, METHOD FOR MANUFACTURING THE CIRCUIT DEVICE, AND SEMICONDUCTOR DEVICE

CROSS-REFERENCE TO RELATED APPLICATION

This application is based upon and claims the benefit of priority from the prior Japanese Patent Application No. 2000-291795, filed Sep. 26, 2000, the entire contents of which are incorporated herein by reference.

BACKGROUND OF THE INVENTION

1. Field of the Invention

The present invention relates to a component-containing substrate that contains electronic components and includes an insulation film made of resin, a method for manufacturing the substrate, and a semiconductor device mounted with a semiconductor chip on the component-containing substrate so as to perform a function.

2. Description of the Related Art

Electronic equipment has recently been decreased in size, reduced in thickness, and improved in performance as semiconductor integrated circuit technology progresses and, accordingly, semiconductor chips or electronic components have been miniaturized and thinned. This has been combined with high density wiring in a circuit board to achieve a high-density module that was difficult to do conventionally. In particular, portable electronic information equipment, such as digital cellular phones and PHSs (Personal Handyphone Systems), which transfer data at a rate of several tens to several hundreds of kbps (kilobits per second) using a quasi-millimeter-wave-band frequency, is desired to further increase in speed in accordance with the development of high-speed communications systems for transferring still and moving images, etc. Accordingly, there has been a demand for semiconductor chip packages and electronic components to be mounted with higher density in order to encase a large-scale, complicated and high-speed circuit in a small-sized casing.

To meet the above demand, the method for mounting a semiconductor chip is changing from a package pattern using a conventional lead frame to a package pattern such as a ball grid array (BGA) and a chip scale package (CSP) that are favorable for miniaturization, thinness, and multiple pins. At present, a CSP of a plurality of semiconductor chips stacked three-dimensionally is being developed. On the other hand, electronic components, which include passive elements such as resistors and capacitors that are mounted on a circuit board with a semiconductor package, are mounted by surface mount technology as chip components of a ceramics package. The size of the components is decreasing from 1005 to 0603.

Even though semiconductor elements and active components decrease in size and improve in integration, since an assembly of semiconductor elements and passive components always requires a physical space for arranging the components, the miniaturization of the entire device and the reduction in electrical distance between the semiconductor element and the passive component is limited. In order to deal with this restriction, a substrate structure containing components is proposed. For example, a semiconductor package containing electronic components such as a resistor, a capacitor and an inductor on a substrate section is disclosed in Rao R. Tumura et al., "Proceedings of IEMT/IMC," 1999, pp 217 to 224. In this package, the electronic components are formed together with a wiring layer in the stage of forming a built-up layer on a core substrate. In this method, however, a step of forming an element is added to that of forming the substrate. Thus, a process is likely to be redundant and an improvement in yield cannot be expected.

Jpn. Pat. Appln. KOKAI Publication No. 11-220262 discloses a conventional stacked structure including a plurality of substrates each mounted with chip components. The components are connected to each other by a conductive paste buried into via holes formed by means of a laser. Since the chip components are commonly used ones, the problem associated with addition of a process is reduced. However, the following problems arise. The thickness of each chip component is 0.5 mm or more and thus that of the structure of the substrates reaches several millimeters. If the thickness of the components is not uniformed, the substrates are difficult to flatten.

Furthermore, an area for providing a connecting portion between a component and an electrode on wiring and that for forming a via hole connecting the substrates are required in addition to a projected area for the chip components. It is thus difficult to achieve a high-density structure.

BRIEF SUMMARY OF THE INVENTION

An object of the present invention is to provide a circuit device containing electronic components and a method for manufacturing the same, and a semiconductor device including semiconductor elements mounted on the circuit device so as to have an active function.

The present invention provides a method for manufacturing a circuit device, comprising a bonding step of pressing a terminal section of an electronic component including an element for performing an electrical function against a wiring substrate having a wiring layer by a tool whose pressing face has a given shape to electrically bond the electronic component and the wiring layer together at the terminal section, and a stacking step of electrically bonding another component to at least part of the terminal section bonded by the tool.

According to the present invention, the electronic components can be thinned, so that the entire substrate can be thinned and the electrical length in the substrate can be shortened. The connected electronic component is hardly broken by the pressure applied when the components are stacked, and the components are reliably bonded to each other, thereby reducing the occurrence of faulty electrical continuity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 2A to 2J are schematic views explaining a method for manufacturing an electronic component of the present invention.

DETAILED DESCRIPTION OF THE INVENTION

Embodiments of the present invention will now be described with reference to the accompanying drawings.
(First Embodiment)

Figure 1:
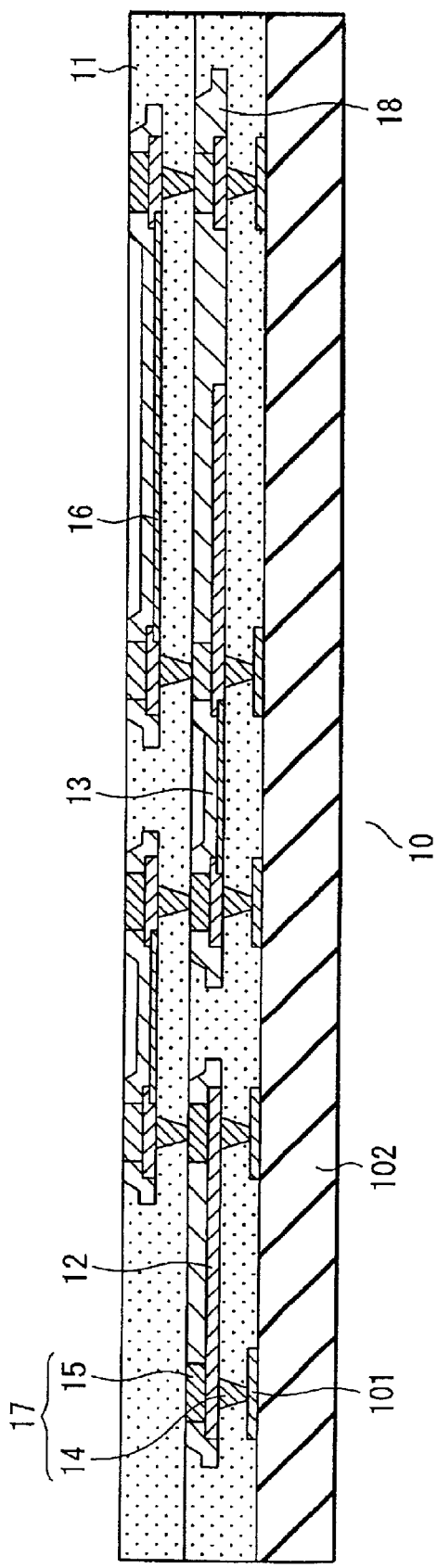
FIG. 1 is a schematic view explaining a component-containing circuit device according to the present invention.

FIG. 1 illustrates a component-containing substrate as a circuit device according to a first embodiment of the present invention. The component-containing substrate is a film-type one that is excellent in flexibility. As illustrated in FIG. 1, a component-containing substrate includes insulating resins 11 stacked on a core substrate 10, a wiring component 12, and an electronic component 13. The core substrate 10 can be formed of a film circuit wiring board including a copper-foil wiring pattern 101 and a polyimide film 102 stacked on each other. However, the substrate can be formed of the insulating resins 11, wiring component 12 and electronic component 13 only, excluding the core substrate 10.

Each of the wiring and electronic components 12 and 13 has a bump electrode 14 and a pad electrode 15 at its end portion arranged in the direction of the thickness these wiring and electronic components 12. These electrodes are used for connecting layers. The insulating resins 11 serve as support members for providing the circuit device with mechanical strength and function as interlayer insulation layers for insulating different wiring layers from each other. The insulation resins 11 can be formed of thermosetting resin, thermoplastic resin, and the like.

Epoxy, Bismaleimido triazine, polyphenyl ether, polyimide, and benzocyclobutene, etc. can be used as the thermosetting resin. Polyethylene, thermoplastic polyimide, etc. can be used as the thermoplastic resin. Filler can be mixed into the substrate when the need arises.

The wiring component 12 can be formed by a conductor containing copper, nickel, gold, silver, tin and the like. In particular, when the wiring component 12 is formed by a conductor containing metal such as copper and nickel that is subject to oxidation, it is desirable that a portion exposed to the surface of the substrate be coated with gold, silver, tin, platinum, zinc, etc. in order to prevent the oxidation. The bump and pad electrodes 14 and 15 are formed in an arbitrary portion of the wiring component. The bump electrode 14 of the wiring component of one layer is electrically connected to the pad electrode 15 of the wiring component of another layer to form a via hole.

The connection of the bump and pad electrodes 14 and 15 is achieved by pressure welding due to stress applied to the bump electrode 14 in its height direction at the time of bonding, interdiffusion caused on the contact surface of the bump and pad electrodes and its vicinity, and alloying. Both the electrodes can be formed of the same materials as those of the wiring component. It is however desirable that the surfaces of the bump and pad electrodes 14 and 15 be coated with each combined metal of gold and tin, copper and tin, gold and aluminum, and silver and tin in order to achieve interdiffusion and alloying at lower temperatures.

The electronic component 13 is a passive component such as a capacitor and an inductor and includes an element section 16 that forms an element main body for performing an electrical function and an electrode section 17 that is a terminal section for electrically coupling the element section 16 to an external device.

The electrode section 17 has one major surface to which a pad electrode 15 is exposed and another major surface to which a bump electrode 14 is exposed. It is desirable that the length from the surface of the pad electrode 15 to the tip of the bump electrode 14 be equal to both the greatest thickness of the electronic component and that of another electronic component contained in the same layer. When a wiring component 12 is provided in the same layer, it is desirable that the above length in the electronic component 13 be equal to that from the surface of the pad electrode 15 to the tip of the bump electrode 14 in the wiring component 12.

If the element section 16 is a resistor having a resistance function, it can be formed of carbon, nickel, chromium alloy, titanium, tungsten alloy, or conductive resin in which these elements are mixed.

When the element section 16 serves as a capacitor, it can be configured to have a stacked structure in which a dielectric such as titanium oxide, strontium titanate, tantalum oxide, silicon oxide, and silicon nitride is sandwiched between conductors such as aluminum, titanium, tantalum, molybdenum, and tungsten in the thickness direction.

The electrode section 17 of the element section 16 is formed of copper, nickel or the like and includes the bump and pad electrodes 14 and 15. It is desirable that the pad electrode 15 be provided in the thickness direction of the bump electrode 14 in terms of a process of manufacturing the circuit device, as will be described later. This desirable condition is true of the bump and pad electrodes 14 and 15 of the wiring component 12.

It is desirable that the element and electrode sections 16 and 17 be coated with a protecting resin 18. The protecting resin 18 has a function of increasing the rigidity of the electronic component 13 and preventing characteristic variations due to dimension variations of the element section 16. In order to improve this function, it is desirable that the protecting resin 18 be formed of a thermosetting resin containing inorganic filler such as silicon oxide, aluminum oxide, and a boron nitride and having a low thermal expansion coefficient. If the element and electrode sections 16 and 17 are integrally supported by the protecting resin 18, an advantage of maintaining an electrical connection between the element and electrode sections 16 and 17 can be obtained.

The above-described component-containing substrate 10 includes a plurality of electronic components each having an element section for performing an electrical function and a terminal section for electrically connecting the element section to another conductive member. By electrically bonding the bump electrode of the terminal section of an electronic component to the terminal section of another electronic component, the electronic components are stacked one on another. An insulating material is buried between the stacked electronic components. Consequently, the control of yields can be performed without applying any load to each of the steps of manufacturing the components and substrates. The circuit devices of the present invention can thus be mass-produced.

Since the electronic components of the present invention are not packaged with ceramics unlike conventional ones, they can be decreased in thickness. Therefore, the entire substrate can be thinned and the electrical length in the substrate can be shortened.

In the component-containing substrate 10, the electrode to which the bump electrode of an electronic component is electrically bonded, is arranged in a direction opposite to the direction in which the bump electrodes are stacked or in the thickness direction of the circuit device. Consequently, the connected electronic component is hardly broken by the pressure applied when the components are stacked, and the components are reliably bonded to each other, thereby reducing the occurrence of faulty electrical continuity.

(Second Embodiment)

FIGS. 2A to 2J show a method for manufacturing a resistance component as the electronic component 13 of the component-containing substrate according to the first embodiment. First, as shown in FIG. 2A, a template 20 is prepared and a recess 21 is formed therein. The recess 21 has an inverted shape of a desired bump electrode (e.g., the bump electrode 14 shown in FIG. 1). It is desirable to use materials, which are excellent in flatness, dimensional stability, processibility, and heat resistance, such as silicon monocrystal, glass, and invar.

If a monocrystalline silicon wafer is used as the template 20, the following anisotropic etching can be performed to form the recess. First, a thermal oxide film is formed on the surface of a wafer having p-type <100> surface orientation. Then, a resist film is formed on the thermal oxide film and exposed and developed to form a 50-$\mu$m-square opening in a recess-forming portion. After that, the thermal oxide film is etched using ammonium fluoride and a hydrofluoric-acid-mixed solution to expose silicon. The resist film is peeled and the exposed silicon is selectively etched using a potassium hydroxide solution. Thus, an inverted-pyramid-shaped recess 21 having a depth of about 35 $\mu$m is formed since the etching rate of <111> surface orientation is considerably lower than that of the other surface orientation.

Referring to FIG. 2B, a seed layer 22 is formed on the template 20 with the recess 21 by deposition, sputtering, CVD, and electroless deposition using metal such as copper, nickel and gold. The seed layer functions as a cathode for electroplating that will be performed afterward. The seed layer also functions as a peeling layer for peeling carriers. To easily peel the carriers in the peeling step and prevent them from being peeled before the peeling step, a material of the seed layer and a method for forming the seed layer should be selected and control the forming conditions such as forming temperatures should be controlled such that the contact strength between the seed layer and the carriers can be set greater than 0.05 kg/cm and smaller than 0.5 kg/cm as peeling strength. In the second embodiment, pure copper is formed to the thickness of 1 $\mu$m at a forming temperature of 50° C. by deposition. It is desirable to rotate an object to be deposited during the deposition in order to improve the coverage of a deposited film near the bottom or tip of the recess 21.

Next, an element main body is formed to fulfill a principal function as an electronic component. If the electronic component is a resistance component, a resistance film 23 is formed on the seed layer 22 by sputtering using an alloy of nickel and chromium as a target, as illustrated in FIG. 2C. The resistance film can be formed only in a desired portion by bringing a metal mask into intimate contact with the template 20, the metal mask having an opening in which the resistance film is to be formed in advance. If the temperature of the substrate is to be set at about 200° C. in sputtering, a closely-packed resistance film can be obtained. Though the substrate temperature is relatively high, it can be used without problems if a monocrystalline silicon wafer is used as the template 20 because the wafer has high heat resistance.

As FIGS. 2D to 2F show, an electrode is formed by a pattern plating method. First, a resist film 24 is formed on the seed layer 22 and resistance film 23, as shown in FIG. 2D. A dry-film resist can be used as the resist film 24. In the second embodiment, a negative dry-film resist having a thickness of 30 $\mu$m is laminated on the seed layer 22.

The above resist is exposed and developed to form a resist pattern including an opening having an inverted electrode pattern. In other words, the opening is formed by removing the resist from above an electrode-forming portion by development and exposing its underlying seed layer 22. In the second embodiment, a silicon substrate that is excellent in flatness and dimensional stability as the template 20. If, therefore, a glass dry plate is used as a mask for forming a pattern at the time of exposure, a very high pattern resolution can be achieved.

After the resist pattern is formed, electroplating is performed using the seed layer 22 as a cathode to form a plated film 25, as illustrated in FIG. 2E. In the electroplating, the seed layer 22 is first plated with gold having a thickness of about 1 $\mu$m and then continuously copper having a thickness of about 20 $\mu$m. In other words, the plated film 25 has a two-layer structure of gold and copper.

In the gold-plating step, a cathode of a DC current source of an electroplating apparatus is connected to the seed layer 22, and a stainless plate is connected to an anode of the DC current source and both are soaked in a plating fluid. As the plating fluid, an aqueous solution having the following composition can be used:

| potassium gold cyanide | 1 to 30 g/L |
|---|---|
| potassium primary phosphate | 1 to 50 g/L |
| potassium secondary phosphate | 1 to 50 g/L |
| potassium nickel cyanide | 0.1 to 5 g/L |

The temperature of the plating fluid is set at 50° C. to 90° C. and the current density is set at 0.1 A/dm$^2$ to 2 A/dm$^2$. The time at which the plating thickness reaches 1 $\mu$m is preset. When the time arrives, power is turned off and the template 20 is removed from the plating apparatus and sufficiently washed with water.

By controlling the composition of the plating fluid and setting the pH value of the plating fluid close to "7", damage can be prevented from being caused to the resist pattern 24. The copper-plating step requires the finest setting of conditions since the form of an electrode depends upon the thickness of the copper plating and the flatness of the surface of the plating. In the plating step, not only the surface of the seed film 22 is plated but also the recess 21 should be filled with plating simultaneously. It is desirable that the surface of the pad electrode be flat. In general, however, a plated film is formed to a uniform thickness in line with the shape of its underlying layer in the copper-plating step using a copper-plating fluid for plating a through hole of a printed circuit board. Therefore, the surface of the electrode directly above the recess 21 is concaved, which is inadequate for the object of the present invention. In order to flatten the surface of the plated electrode, the copper-plating rate in the recess should be set higher than that in the electrode-forming portion other than the recess. To do so, an electro-plating process performed by a periodically inverted electric field can be applied to the present invention.

Figure 3:
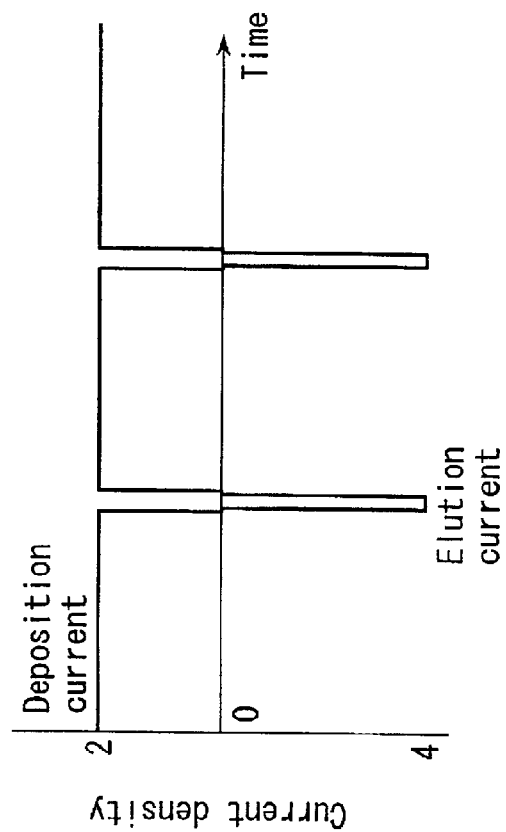
FIG. 3 is a chart explaining plating conditions for a method for manufacturing an electronic component of the present invention.

The electroplating process performed by a periodically inverted electric field of copper using a pulse current source for supplying current whose direction is reversed periodically, will now be described. First, one electrode of the pulse current source is connected to the seed layer 22, and the other electrode thereof is connected to a phosphorus-contained copper plate. The current source is capable of providing a current pattern that alternates between positive and negative periodically as shown in FIG. 3. If electrons are supplied to the seed layer 22 when the phosphorus-contained copper plate corresponds to an anode and the seed layer 22 corresponds to a cathode, $Cu^{2+}$ in the plating fluid is reduced and copper is deposited on the surface of the seed layer 22. On the other hand, when the phosphorus-contained copper plate corresponds to a cathode and the seed layer 22 corresponds to a cathode by alternation of current, electrons are eliminated from the copper deposited on the surface of the seed layer 22 to generate copper ions and elute copper. If an amount of deposition of copper is larger than that of elution, copper will be deposited on the surface of the seed layer 22. In other words, the deposition of copper at the current density of 2 A/$dm^2$ for 10 ms and the elution of copper at the current density of 4 A/$dm^2$ for 0.5 ms are repeated. Since the amount of elution is smaller than that of deposition, a copper film is formed finally. However, the current density of the elution is higher and thus the amount of elution in a peripheral portion of the recess 21 on which current is likely to concentrate is larger than that in the recess 21, with the result that the plating rate in the recess 21 is increased. The surface of the plating is flattened accordingly. As the plating fluid, an acid aqueous solution having the following composition can be used:

| | |
|---|---|
| Copper sulfate 5-hydrate | 50 to 200 g/L |
| Sulfuric acid (specific gravity 1.84) | 50 to 200 g/L |
| Hydrochloric acid (37%) | 0.05 to 0.3 mL/L |
| Polyethylene glycol | 5 to 200 ppm |
| and a suitable amount of organic sulfide compounds | 1 to 200 ppm |

The time at which the thickness of the plated film 25 reaches 20 μm is preset. When the time arrives, power is turned off and the template 20 is removed from the plating apparatus and sufficiently washed with water. When the plating is performed under the above conditions, the inverted-pyramidal recess having a depth of 35 μm is completely filled and the surface of the plated film 25 is flattened including the portion directly above the recess 21, though the thickness of the plated film is 20 μm.

After that, as shown in FIG. 2F, the resist pattern is removed by a sodium hydroxide solution to form a bump electrode on the template 20. At this time, the electrodes and resistance films are still electrically connected to each other by means of the seed layer 22.

In order to enhance the adherence among a protection resin to be formed subsequently, the side of the copper-plated film 25 and the seed layer 22m, the side of the plated film 25 and the surface of the seed layer 22 are roughed. The roughing process may include a so-called blacking process for oxidizing copper, a reducing process for reducing the copper oxide further, and a process for depositing needle crystal by electroless copper plating. In the second embodiment, the reducing process is performed after the blacking process.

After that, a protection resin 26 is formed on the entire surface of the template 20 as illustrated in FIG. 2G. A thermosetting resin and a thermoplastic resin as indicated in the first embodiment or a photosetting resin can be employed as materials for the protection resin 26. The form of the resin 26 is a liquid and a film. When a liquid polyimide resin is used, the template 20 is coated with varnish of a nonphotosensitive polyimide resin by the spin coat process, curtain coat process, and printing process to form a coated film having a thickness of about 20 μm. After that, the protection resin 26 is cured to be polymerized and hardened. If the surface contacting the resin is roughed, the resin flows along the roughed surface to form a solid anchor when the resin is applied. Therefore, the adherence of the plated film 25 and seed layer 22 to the cured resin 26 is high, and the peel strength of about 1 Kgf/cm can be achieved.

If the protection resin 26 is formed as a protection film, a usable electronic component is completed. There may be a case where an additional electrode for connecting layers is provided. When the plated film 25 is sealed with the protection resin 26, a pad-electrode opening having a diameter of about 150 μm is formed in the protection resin 26 by $CO^2$ laser to expose the surface of the plated film 25. It is desirable that the opening be formed directly above the recess 21 in terms of electrical length and mechanical strength.

After that, the resin surface can slightly be etched by a permanganate aqueous solution with a view to eliminating a smear caused by laser beam machining. The laser beam machining can be replaced with oxygen-plasma ashing to execute the same processing.

If the plated film 25 is exposed, the layers can be connected to each other. In order to fill the opening with conductive materials further, the opening is electroplated using the seed layer 22 as a cathode to form a pad electrode 27 out of the plated film, as illustrated in FIG. 2H. In the electroplating, the seed layer 22 is first plated with copper having a thickness of about 20 μm and then continuously tin having a thickness of about 1 μm. The copper plating can be performed by the same method as described with reference to FIG. 2D.

In the tin-plating, the cathode of the DC current source of the electroplating apparatus is connected to the seed layer 22, and the anode of the DC current source is connected to a tin plate. As the plating fluid, an acid aqueous solution having the following composition can be used:

| | |
|---|---|
| tin borofluoride | 10 to 300 g/L |
| fluoroboric acid | 10 to 200 g/L |
| boric acid | 10 to 50 g/L |
| β-naphthol | 0.1 to 10 g/L |
| gelatin | 1 to 20 g/L |

The temperature of the plating fluid is set at 20° C. to 50° C. and the current density is set at 1 A/$dm^2$ to 5 A/$dm^2$. The time at which the plating thickness reaches 1 μm is preset. When the time arrives, power is turned off and the template 20 is removed from the plating apparatus and sufficiently washed with water. In the second embodiment, a nonphotosensitive thermosetting resin is used; however, a photosensitive resin such as an ultraviolet thermosetting resin can be done. In this case, the exposing and developing step can be executed without using any laser beam machining to form the opening. It is desirable to remove a development residue from the pad electrode 27 by wet etching using a permanganate aqueous solution and ashing using oxygen plasma.

Then, only the template 20 is peeled off while the protection resin 26 holds the electrode and element, as shown in FIG. 2I. The adherence between the seed layer 22 and the protection resin 26 is controlled at about 1 Kgf/cm and it is two or more times as high as that between the template 20 and the seed layer 22. Thus, the seed layer 22 functions as a peeling layer and the template 20 is peeled from the interface between the template 20 and the seed layer 22. The peeled template 20 can be reused after the seed-layer forming step shown in FIG. 2B.

A sheet 28 containing an electronic component buried in the protection resin is thus obtained from the above-described steps. The surface of the pad electrode 27 is exposed to one major surface of the sheet 28. A projection, which stands 35 μm high on the surface of the resistance film 23 serving as an element main body, is provided on the other major surface of the sheet 28. The entire surface including the projection is covered with the seed layer 22. If the sheet 28 so obtained is slightly etched by a mixed aqueous solution of ammonium persulfate, sulfuric acid and ethanol, the seed layer 22, which is formed of a thin copper film having a thickness of about 1 μm, can be eliminated. Finally, the peripheral portion of the electronic component is punched in, thereby obtaining an electronic component 30, as illustrated in FIG. 2J.

FIGS. 2A to 2I illustrate only one electronic component. However, a plurality of electronic components can be arrayed appropriately in accordance with the area of the major surface of the template 20. Sheets 28 of the arrayed electronic components are processed and individual electronic components 30 are obtained.

In the electronic component manufactured through the foregoing process, the shapes and heights of the bump electrode formed on one major surface and the protection resin formed on the other major surface or the pad electrode can be uniformed with high precision. If, therefore, a plurality of components are contained in the wiring substrate, the major surface of the substrate is easy to flatten and thus the wiring layers are easy to stack. Furthermore, the element can easily be thinned and, when it is contained in the wiring substrate, the wiring substrate can be thinned. Since the bump electrode is shaped like an inverted pyramid, the step of containing the bump electrode in the wiring substrate can be simplified. Since, moreover, the pad electrode for connecting the layers is formed directly above the bump electrode, the electronic components are hard to break when they are stacked.

If, as shown in FIG. 2J, the electronic component is so designed that the height from the tip of the bump electrode to the surface of the pad electrode or the height from the tip of the electrode on one major surface to the surface of the electrode on the other major surface corresponds to the largest thickness of the electronic component, the thickness can be inhibited from being varied with conditions such as heat. The stacked wiring substrate containing the electronic component is therefore easy to manufacture. In this structure, bump electrodes can be formed on both the major surfaces. The bump electrode need not be shaped like an inverted pyramid but can be shaped like a sphere or a column according to a method of manufacturing the stacked wiring substrate.

Since an electrode of an electronic component is bonded to that portion of a terminal section of another electronic component which is pressed by a bonding tool, a plurality of portions to be bonded are arranged on a predetermined surface that depends upon the shape of the pressing face of the bonding tool. Therefore, the manufacturing apparatus becomes easy to control in the bonding step. Since the wiring components are prepared like the electronic components, the yield of the wiring-layer forming step can be improved when the stacked wiring substrate is formed.

The second embodiment is directed to a method for manufacturing a resistance component. If the wiring patterns to be sputtered and the materials for sputtering them are combined in the step shown in FIG. 2C, the passive component such as a capacitor and an inductor can be obtained. In particular, when the passive component is simply used as a jumper, it can be manufactured by omitting the sputtering step and connecting the plated film 25 to the plurality of recesses 21. According to the circuit device of the present invention and its manufacturing method, an electrode having a bump can easily be produced; consequently, a stacked component-containing circuit device, which is thin and whose surface is flat, can be provided by a simple method.

(Third Embodiment)

FIGS. 4A to 4E show a method of manufacturing a component-containing circuit device as described in the first embodiment. It is desirable to use the electronic component 13 of the second embodiment as that of the third embodiment. A wiring component including a pad electrode and a bump electrode can be formed by the steps shown in FIGS. 2A, 2B and 2D to 2J in the manufacturing method of electronic components in the second embodiment.

Figure 4A:
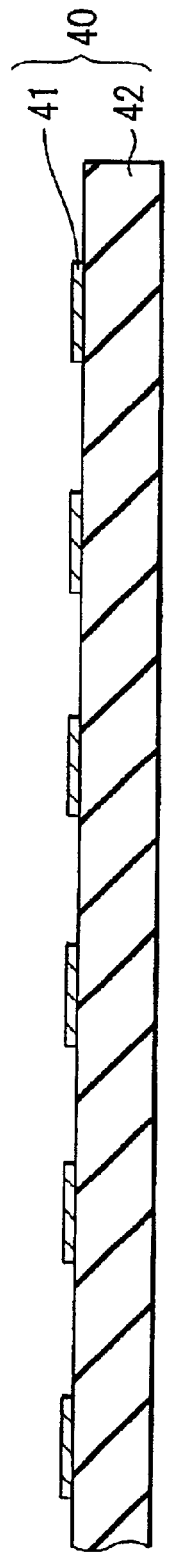
FIGS. 4A to 4E are schematic views explaining a method for manufacturing a component-containing circuit device according to the present invention.

First, a core substrate 40 including a first wiring layer 41 and a polyimide layer 42 is prepared as shown in FIG. 4A. The layer 41 is formed on the surface of the layer 42. For example, a two-layered film containing a 18-μm-thickness copper foil and a 50-μm-thickness polyimide film 42 adhered to each other can be used as the core substrate. The copper foil can be processed to serve as a wiring pattern. The first wiring layer 41 is formed by a normal subtractive method. First, a tin film having a thickness of about 1 μm is formed on the copper foil by electroplating and then spin-coated with a liquid positive resist to form a resist film having a thickness of about 5 μm. After that, the resist film is baked and subjected to exposure and development, and a wiring pattern is formed on the resist film. The copper foil other than the wiring pattern is etched by a mixed aqueous solution of hydrochloric acid, nitric acid and acetic acid. The remaining resist film is dissolved and eliminated to thereby form a first wiring layer 41.

Figure 4B:
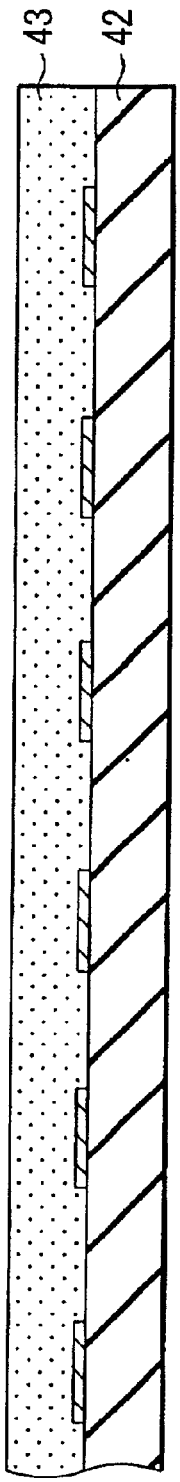

As FIG. 4B shows, an insulative resin layer 43 is formed on the core substrate 40 as an interlayer insulation layer. A nonphotosensitive polyimide (PMDA-ODA) resin can be used as the insulative resin. Varnish of the resin is applied to the entire major surface of the core substrate 40 on which the first wiring layer 41 is formed by the printing and curtain coat methods, thereby forming a coated film having a thickness of about 50 μm. After that, the resultant structure is baked at 80° C. for 20 minutes and then dried. In this state, the degree of polymerization of the polyimide resin ranges from 30% to 50% and the hardness thereof is 20 Hd or lower. The polyimide resin is thus soft.

Figure 4C:
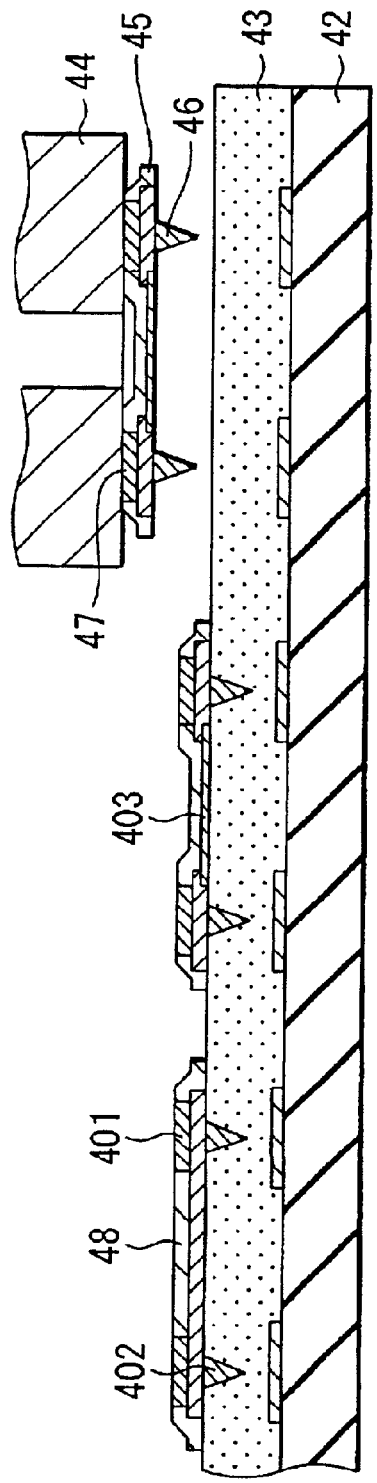

As FIG. 4C shows, an electronic component 45 is mounted on the insulative resin layer 43. The electronic component 45 includes an inverted-pyramid-shaped bump electrode 46 that protrudes about 35 μm from an element-forming portion. The electronic component 45 also includes a pad electrode 47 formed on the surface other than the major surface on which the bump electrode 46 is formed. The pad electrode 47 is adsorbed and held by a mounter head 44, and the bump electrode 46 is pressed on and buried in the insulative resin layer 43. The electronic component 45 is therefore fixed provisionally.

The electronic component 45 and the first wiring layer 41 can be bonded to each other at this time. Since, however, the electronic component 45 is fixed provisionally, the first wiring layer 41 and the bump electrode 46 need not always contact each other, but the bump electrode 46 has only to be pressurized to such an extent that it is buried in the resin layer 43. After the pressurization, the adsorption of the mounter head is released and thus other electronic and wiring components 45 and 48 can be mounted on the insulative resin layer 43. The wiring component 48 corresponds to the electronic component excluding a resistance portion but including a pad electrode 401 and a bump electrode 402 that are integrated as one unit by a copper-plated film. The electronic components to be required first are mounted in advance and bonded at once afterwards, thus making it possible to shorten the time for manufacture.

Figure 4D:
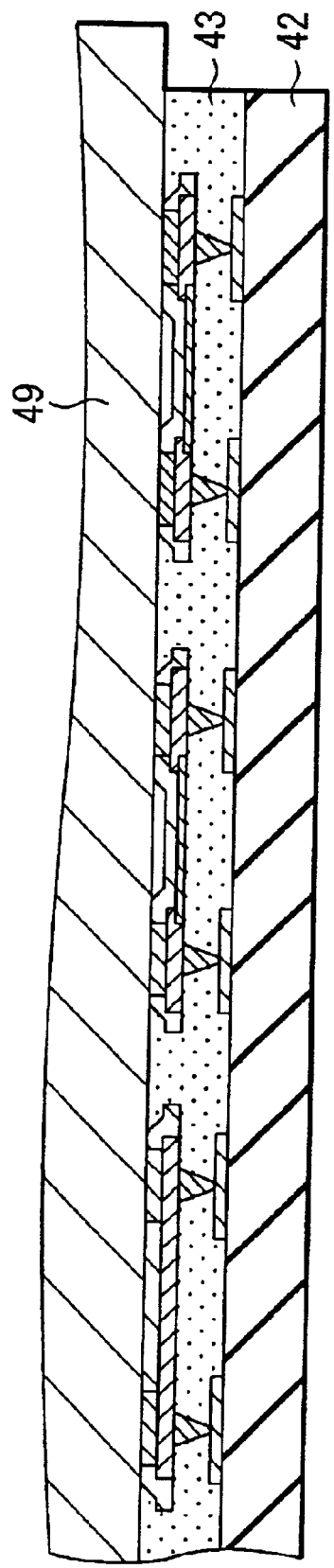

As FIG. 4D illustrates, the entire substrate to which the electronic and wiring components 45 and 48 are provisionally fixed is pressed by a tool whose pressing face has a given shape. The temperature of a press head 49 used as the tool ranges from 200° C. to 400° C. The surface of the substrate is pressed and held at a pressure of 10 kg/cm$^2$ to 80 kg/cm$^2$ for 10 seconds to 600 seconds by the plane-shaped pressing face of the press head 49. This thermal pressure causes the resin materials of the insulative resin layer 43 to flow and brings the bump electrodes 46 and 402 of the pressed electronic and wiring components 45 and 48 into contact with the electrode of their underlying first wiring layer 41. Thus, the gold coating the surface of the bump electrode 46 and the tin coating the surface of the electrode of the first wiring layer 41 are diffused each other and become eutectic to form a junction. If the substrate is thermally pressed further, the polymerization reaction of the resin material advances and the degree of polymerization of PMDA-ODA reaches almost 100%.

When the electronic component 45 is pressurized, the press head 49 contacts the surface of the pad electrode 47 and presses the electronic component into the resin layer 43, the distance between the pad electrode 47 and the tip of the bump electrode 46 corresponding to the maximum thickness of the electronic component 45. Though the electronic component 45 is pressed into the resin layer 43 by pressurization, the flowing resin hardly covers the surface of the pad electrode 47. Since the bump electrode 46 is formed opposite to the pad electrode 47, a bending stress is hard to produce on an element section 403 of the electronic component when the component is pressurized. In addition, all the bump and pad electrodes 46 and 47 of the electronic and wiring components 45 and 48 mounted on the same layer are brought into reliable contact with each other if all the distances between the bump and pad electrodes are the same. A slight variation may occur in the thickness of the components. If, however, the variation falls within an amount of deformation of the bump electrode 46 caused by the pressurization, no problems will arise because the variation is within tolerance.

Figure 4E:
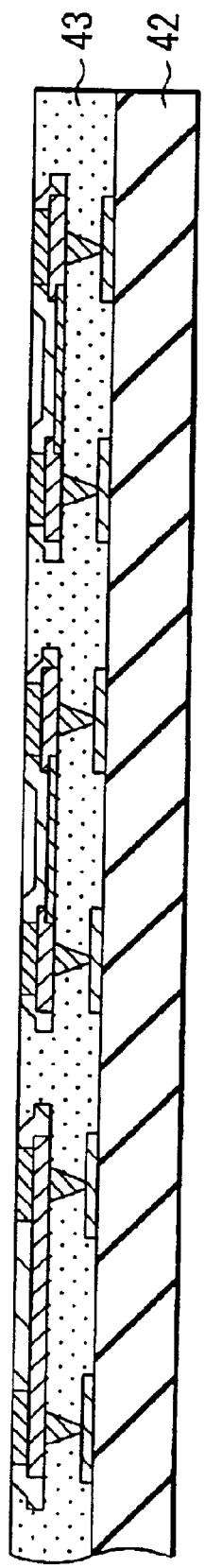

When the thermal pressing step is completed, a component-containing circuit device having a flat surface to which the shape of the pressing face of the tool is transferred is obtained as illustrated in FIG. 4E. After that, the steps of FIGS. 4B to 4E are repeated to form a component-containing circuit device as shown in FIG. 1. Moreover, the steps of FIGS. 4B to 4E are repeated a plurality of times to form a component-containing substrate having a given number of layers. A layer containing an electronic component can be formed on the surface opposed to the core substrate through the same steps as described above.

(Fourth Embodiment)

Figure 5:
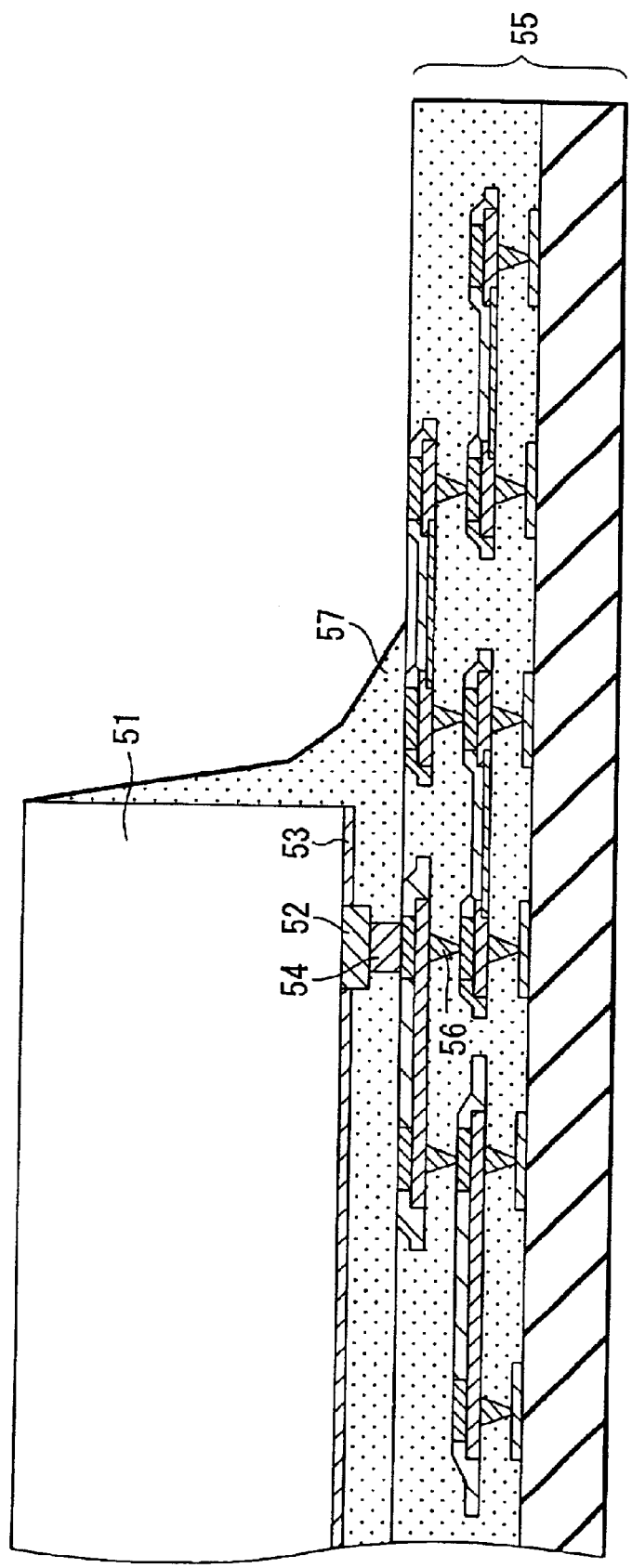
FIG. 5 is a schematic view explaining a semiconductor device of the present invention.

FIG. 5 illustrates a semiconductor device according to a fourth embodiment of the present invention. FIG. 5 is a partly enlarged view of a semiconductor chip serving as an active element that is face-bonded to a film-type component-containing substrate by a flip-chip bonding process. The semiconductor chip is a bare chip 51 on which a semiconductor integrated circuit is formed. A connection pad 52 and a passivation film 53 for protecting the semiconductor integrated circuit are formed on the surface of the chip 51. A bump electrode 54 is formed of gold, copper, nickel, solder or the like on the connection pad 52. The bump electrode 54 can be formed by plating, wire bonding, etc.

A component-containing substrate 55 is one as described in the first embodiment. A pad electrode 56, which is connected to the connection pad 52 of the bare chip 51, is exposed to the surface of the substrate 55. The bump electrode 54 and pad electrode 56 are electrically connected to each other by aligning and mounting the bare chip 51 using a flip-chip bonder. The bump and pad electrodes 54 and 56 can be connected by the use of a sealing resin 57 such as an anisotropic conductive film and an anisotropic conductive paste into which inorganic fillers of silica are dispersed.

According to the semiconductor device so configured, the spatial and electrical distance between the active element and the passive element including a component-containing substrate can be shortened. The time delay of electrical signals is lessened and the speed of the device is increased. Since the semiconductor device is a component-containing circuit device the surface of which is flattened, the semiconductor chip can be mounted with high yield. After the mounting, the reliability of connection of the chip is improved.

The circuit device of the fourth embodiment is not limited to the mounting of a bare chip using a bump electrode. If an electronic component has a terminal to be connected to the pad electrode 56, it can be mounted. A plurality of bare chips can be mounted by the following steps. An adhesion layer is provided on the bare chip 51 of the fourth embodiment, a second bare chip is mounted on the adhesion layer face up, and a connection pad of the second bare chip is connected to the component-containing substrate 55 by the wire bonding process.

The present invention is not limited to the above embodiments. Various changes and modifications can be made without departing the scope of the subject matter of the invention. For example, the core substrate, template, seed layer, wiring, electrode, resin, plating fluid, and etchant can be varied in materials, dimensions, and the like. Needless to say, the conditions of electroplating or etching are not limited to those of the above embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a circuit device, comprising:

mounting a plurality of electronic components on an insulation layer, the insulation layer stacked on a wiring layer of a wiring substrate, the electronic components each including an element to perform an electrical function and each having a bump electrode on one side and a pad electrode on the other side in such a manner that the bump electrode is buried into the insulation layer, the bump electrodes of the electronic components having substantially same height;

pressing the pad electrode of each of the mounted electronic components with a heater tool having a planar pressing face to pattern a surface of the insulation layer after the pressing face, and pressing the electronic components into the insulation layer until the pad electrode reaches the surface of the insulation layer to mechanically bond the electronic components and the wiring layer together at the bump electrodes and then harden the insulation layer; and electrically bonding another component to at least part of the pad electrodes pressed by the heater tool.

* * * * *